United States Patent
Hirasawa

[11] Patent Number: 6,072,413
[45] Date of Patent: Jun. 6, 2000

[54] CURRENT OUTPUT TYPE DIGITAL-TO-ANALOG CONVERTER CAPABLE OF SUPPRESSING OUTPUT CURRENT FLUCTUATION USING A CURRENT MIRROR

[75] Inventor: Shinichi Hirasawa, Yamagata, Japan

[73] Assignee: NEC Corporation, Japan

[21] Appl. No.: 08/969,349

[22] Filed: Nov. 28, 1997

[30] Foreign Application Priority Data

Nov. 28, 1996 [JP] Japan .................................. 8-317605

[51] Int. Cl.[7] .................................................. H03M 1/66
[52] U.S. Cl. ........................................ 341/144; 341/118
[58] Field of Search .................................. 323/313, 315;
341/144, 120, 145, 153, 135, 118

[56] References Cited

U.S. PATENT DOCUMENTS

| | | | |
|---|---|---|---|
| 5,841,382 | 11/1998 | Walden et al. ....................... | 341/144 X |
| 5,870,043 | 2/1999 | Hiromi .................................. | 341/120 |
| 5,892,471 | 4/1999 | Mahant-Shetti et al. ............. | 341/135 |

FOREIGN PATENT DOCUMENTS

| | | |
|---|---|---|
| 57-178419 | 11/1982 | Japan . |
| 58-71725 | 4/1983 | Japan . |
| 61-95623 | 5/1986 | Japan . |
| 1-65530 | 4/1989 | Japan . |
| 64-819 | 5/1989 | Japan . |
| 3-74924 | 3/1991 | Japan . |
| 3-106224 | 5/1991 | Japan . |
| 10-13235 | 1/1998 | Japan . |

*Primary Examiner*—Brian Young
*Assistant Examiner*—Patrick Wamsley
*Attorney, Agent, or Firm*—Ostrolenk, Faber, Gerb & Soffen, LLP

[57] ABSTRACT

In a digital-to-analog converter, a logic circuit includes a plurality of MOS transistors each having a gate connected to one of input signal lines, a drain connected to a first power supply terminal and a source which has one of a connection state where the source is connected to one of output signal lines and a disconnection state where the source is not connected to the output signal lines. A reference current source includes a constant current source and a first transistor connected in series. A digital-to-analog conversion section includes a plurality of second transistors each connected to one of the output signal lines and to the first transistor. Each of the second transistors forming a current mirror circuit with the first transistor. The digital-to-analog conversion section also includes a plurality of third transistors each connected between an output terminal and one of the output signal lines.

2 Claims, 5 Drawing Sheets

Fig. 2 PRIOR ART

| DECIMAL CODE | GRAY CODE ($S_2, S_1, S_0$) | BINARY CODE ($D_2, D_1, D_0$) |
|---|---|---|
| 0 | 0 0 1 | 0 0 0 |
| 1 | 0 0 0 | 0 0 1 |
| 2 | 0 1 0 | 0 1 0 |
| 3 | 0 1 1 | 0 1 1 |
| 4 | 1 1 1 | 1 0 0 |
| 5 | 1 1 0 | 1 0 1 |
| 6 | 1 0 0 | 1 1 0 |
| 7 | 1 0 1 | 1 1 1 |

CURRENT OUTPUT TYPE DIGITAL-TO-ANALOG CONVERTER CAPABLE OF SUPPRESSING OUTPUT CURRENT FLUCTUATION USING A CURRENT MIRROR

BACKGROUND OF THE INVENTION

1. Field of the Invention

The present invention relates to a digital-to-analog (D/A) converter, and more particularly, to the improvement of the fluctuation of an output current of a current output type D/A converter.

2. Description of the Related Art

A current output type D/A converter has the following advantages:

- output impedance can be reduced;
- high speed operation is possible;
- high precision resistors are unnecessary;
- the converter is easily incorporated into an integrated circuit (IC); and
- a high speed clock signal is unnecessary.

A prior art D/A converter of this kind (see JP-A-61-95623) is constructed by a logic circuit, a reference current source, and a digital-to-analog conversion section connected between the logic circuit and the reference current source. In this case, bipolar transistors of the digital-to-analog conversion section form current mirror circuits with a bipolar transistor of the reference current source. This will be explained later in detail.

In the above-mentioned prior art D/A converter, however, a resistance by switching means is introduced into each of the current mirror circuits, so that the output current is fluctuated. On the other hand, in order to minimize the above mentioned resistances and the fluctuation thereof, transistors used as the switching means can be large in size, which, however, decreases the integration.

SUMMARY OF THE INVENTION

It is an object of the present invention to provide a current output type D/A converter capable of suppressing the fluctuation of an output current.

According to the present invention, in a D/A converter, a logic circuit includes a plurality of MOS transistors each having a gate connected to one of input signal lines, a drain connected to a first power supply terminal and a source which has one of a connection state where the source is connected to one of output signal lines and a disconnection state where the source is not connected to the output signal lines. A reference current source includes a constant current source and a first transistor connected in series. A digital-to-analog conversion section includes a plurality of second transistors each connected to one of the output signal lines and to the first transistor. Each of the second transistors forming a current mirror circuit with the first transistor. The digital-to-analog conversion section also includes a plurality of third transistors each connected between an output terminal and one of the output signal lines.

Thus, there is no substantial resistance between the first transistor and the second transistors within the current mirror circuits.

BRIEF DESCRIPTION OF THE DRAWINGS

The present invention will be more clearly understood from the description as set forth below, as compared with the prior art, with reference to the accompanying drawings, wherein:

FIG. 2 is a table showing the input/output relationship of the logic circuit of FIG. 1;

DESCRIPTION OF THE PREFERRED EMBODIMENTS

Before the description of the preferred embodiments, a prior art D/A converter will be explained with reference to FIG. 1 (see JP-A-61-95623).

Figure 1:
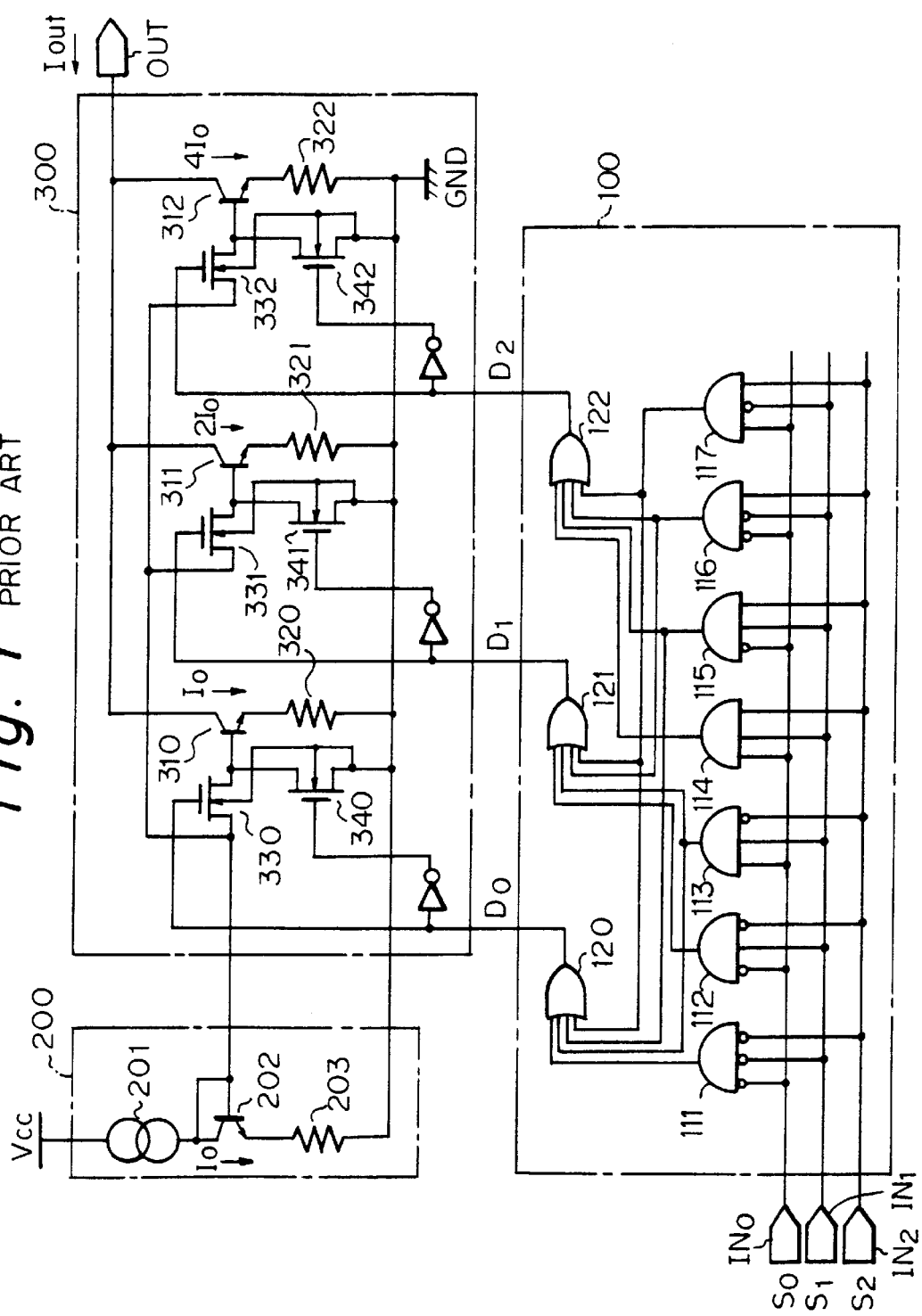
FIG. 1 is a circuit diagram illustrating a prior art D/A converter.

In FIG. 1, reference numeral 100 designates a logic circuit for converting a 3-bit Gray code signal formed by bits $S_0$, $S_1$ and $S_2$ into a 3-bit binary code signal formed by $D_0$, $D_1$ and $D_2$ which has a relationship with the 3-bit Gray code signal ($S_2$, $S_1$, $S_0$) as shown in FIG. 2. The logic circuit 100 is constructed by seven three-input gate circuits 111, 112, . . . , 117 connected to input terminals $IN_0$, $IN_1$ and $IN_2$ for receiving the Gray code signal ($S_2$, $S_1$, $S_0$), and three OR circuit 120, 121 and 122 each connected to four of the gate circuits 111, 112, . . . , 117. That is, the logic circuit 100 serves as a decoder for decoding the Gray code signal ($S_2$, $S_1$, $S_0$) to generate the binary code signal ($D_2$, $D_1$, $D_0$).

Also, a reference current source 200 is constructed by a constant current source 201, a collector-base connected NPN type bipolar transistor 202 and a resistor 203. In this case, the mutual conductance of the bipolar transistor 202 is defined by $g_m$, and a current $I_0$ flows therethrough.

Further, a digital-to-analog conversion section 300 receives the binary code signal ($D_2$, $D_1$, $D_0$) to generate an output current $I_{out}$ at an output terminal OUT in accordance with the binary code signal ($D_2$, $D_1$, $D_0$). The digital-to-analog conversion section 300 is powered by the reference current source 200.

The digital-to-analog converter 300 is constructed by an NPN type bipolar transistor 310 and a resistor 320 connected in series between the output terminal OUT and a ground terminal GND, an NPN type bipolar transistor 311 and a resistor 321 connected in series between the output terminal OUT and the ground terminal GND, and an NPN type bipolar transistor 312 and a resistor 322 connected in series between the output terminal OUT and the ground terminal GND. Also, N-channel MOS transistors 330, 331 and 332 are connected between the reference current source 200 and the bases of the bipolar transistors 310, 311 and 312, and are controlled by the binary code bits $D_0$, $D_1$ and $D_2$, respectively. Further, N-channel MOS transistors 340, 341 and 342 are connected between the ground terminal GND and the bases of the bipolar transistors 310, 311 and 312, and are controlled by the inverted signals of the binary code bits $D_0$, $D_1$ and $D_2$, respectively.

The emitter areas of the bipolar transistors 310, 311 and 312 are determined so that the mutual conductances of the bipolar transistors 310, 311 and 312 are caused to be $g_m$, $2g_m$ and $4(=2^2)g_m$, respectively.

When the bit $D_0$ of the binary code signal of the logic circuit 100 is high, the transistors 330 and 340 are turned ON and OFF, respectively, so that the transistors 202 and 310 form a current mirror circuit. In this case, since the mutual conductance of the transistor 310 is the same as that the transistor 202, a current $I_0$ flows through the transistor 310. On the other hand, when the bit $D_0$ of the binary code signal of the logic circuit 100 is low, the transistors 330 and 340 are turned OFF and ON, respectively, so that the transistor 310 is turned OFF.

Also, when the bit $D_1$ of the binary code signal of the logic circuit 100 is high, the transistors 331 and 341 are turned ON and OFF, respectively, so that the transistors 202 and 311 form a current mirror circuit. In this case, since the mutual conductance of the transistor 311 is twice that of the transistor 202, a current $2I_0$ flows through the transistor 311. On the other hand, when the bit $D_1$ of the binary code signal of the logic circuit 100 is low, the transistors 331 and 341 are turned OFF and ON, respectively, so that the transistor 311 is turned OFF.

Further, when the bit $D_2$ of the binary code signal of the logic circuit 100 is high, the transistors 332 and 342 are turned ON and OFF, respectively, so that the transistors 202 and 312 form a current mirror circuit. In this case, since the mutual conductance of the transistor 312 is four times that the transistor 202, a current $4I_0(=2^2I_0)$ flows through the transistor 312. On the other hand, when the bit $D_2$ of the binary code signal of the logic circuit 100 is low, the transistors 332 and 342 are turned OFF and ON, respectively, so that the transistor 312 is turned OFF.

In FIG. 1, however, in each of the current mirror circuits, if a resistance between the bases of the two transistor 202 and 310 (311, 312) is large, the output currents $I_0$, $2I_0$ and $4I_0$ include error components. Also, if such resistances are different from each other, the output currents $I_0$, $2I_0$ and $4I_0$ also include error components. Therefore, in order to minimize the above-mentioned resistances and the fluctuation thereof, the transistors 330, 331 and 332 have to be large in size, which decreases the integration.

Also, in FIG. 1, when the number of bits of the input signal is increased, the number of elements of logic circuit 100 is remarkably increased, which also decreases the integration.

Figure 3:
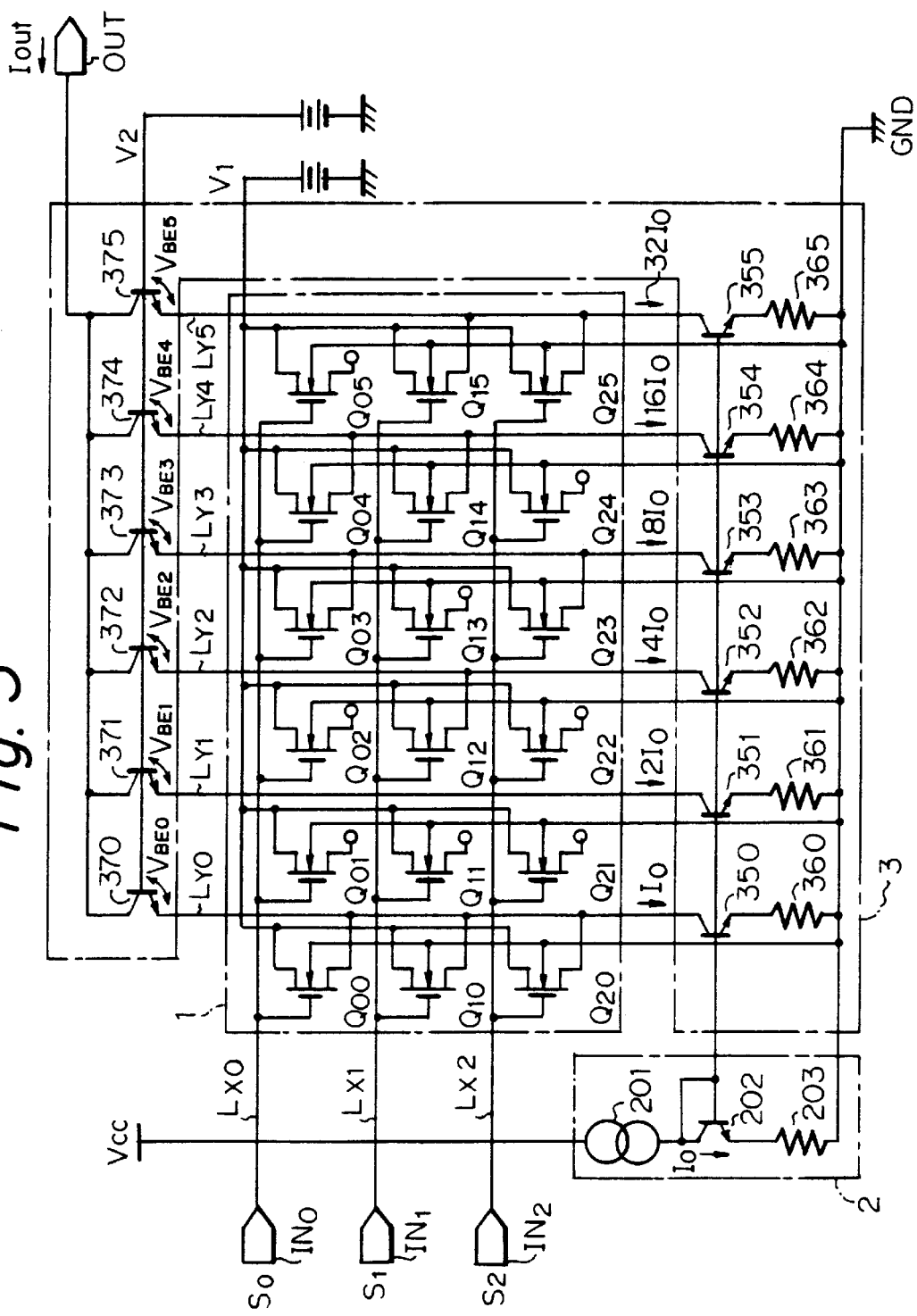
FIG. 3 is a circuit diagram illustrating a first embodiment of the D/A converter according to the present invention.

In FIG. 3, which illustrates a first embodiment of the present invention, a logic circuit 1 is connected to signal lines $L_x^0$, $L_x^1$ and $L_x^2$ connected to input terminals $IN_0$, $IN_1$ and $IN_2$, respectively, and signal lines $L_y^0$, $L_y^1$, ..., $L_y^5$, and is constructed by MOS transistors $Q_{00}$, $Q_{01}$, ..., $Q_{05}$, $Q_{10}$, $Q_{11}$, ..., $Q_{15}$, $Q_{20}$, $Q_{21}$, ..., $Q_{25}$ located at intersections of the signals $L_x^0$, $L_x^1$ and $L_x^2$ and $L_y^0$, $L_y^1$, ..., $L_y^5$. In this case, the gates of the transistors $Q_{00}$, $Q_{01}$, ..., $Q_{05}$ are connected to the signal line $L_x^0$, the gates of the transistors $Q_{10}$, $Q_{11}$, ..., $Q_{15}$ are connected to the signal line $L_x^1$, and the transistors $Q_{20}$, $Q_{21}$, ..., $Q_{25}$ are connected to the signal line $L_x^2$. Also, the drains of the transistors $Q_{00}$, $Q_{10}$, $Q_{20}$, $Q_{10}$, $Q_{11}$, ..., $Q_{15}$, $Q_{20}$ $Q_{21}$, ..., $Q_{25}$ are connected to a power supply whose voltage is $V_1$. On the other hand, some of the sources of the transistors are connected to the corresponding signal line $L_y^0$, $L_y^1$, ..., $L_y^5$, while the other are not connected to the signal lines $L_y^0$, $L_y^1$, ..., $L_y^5$. Thus, the transistors $Q_{01}$, $Q_{02}$, ..., $Q_{25}$ form a (3 rows, 6 columns) matrix similar to a memory cell array of a read-only memory.

Also, a reference current source 2 having the same configuration as the reference current source 200 is provided.

Further, a digital-to-analog conversion section 3 is constructed by an NPN type bipolar transistor 350 and a resistor 360 connected in series between the signal line $L_y^0$ and the ground terminal GND, an NPN type bipolar transistor 351 and a resistor 361 connected in series between the signal line $L_y^1$ and the ground terminal GND, an NPN type bipolar transistor 352 and a resistor 362 connected in series between the signal line $L_y^2$ and the ground terminal GND, an NPN type bipolar transistor 353 and a resistor 363 connected in series between the signal line $L_y^3$ and the ground terminal GND, an NPN type bipolar transistor 354 and a resistor 364 connected in series between the signal line $L_y^4$ and the ground terminal GND, and an NPN type bipolar transistor 355 and a resistor 365 connected in series between the signal line $L_y^5$ and the ground terminal GND. The emitter areas of the bipolar transistors 350, 351, 352, 353, 354 and 355 are determined so that the mutual conductances of the bipolar transistor 350, 351, 352, 353, 354 and 355 are caused to be $g_m$, $2g_m$, $4(=2^2)g_m$, $8(=2^3)g_m$, $16(=2^4)g_m$ and $32(=2^5)g_m$, respectively. In this case, the bases of the transistors 350, 351, ..., 355 are connected to the base and collector of the transistor 202 of the reference current source 2. Therefore, if the transistors 350, 351, 352, 353, 354 and 355 are active, the transistor 350, 351, 352, 353, 354 and 355 with the transistor 202 form current mirror circuits, so that currents $I_0$, $2I_0$, $4(=2^2)I_0$, $8(=2^3)I_0$, $16(=2^4)I_0$ and $32(-2^5)I_0$ flow through the transistors 350, 351, 352, 353, 354 and 355, respectively.

The digital-to-analog conversion section 300 is also constructed by NPN type bipolar transistor 370, 371, 372, 373, 374 and 375 connected between an output terminal OUT and the signal lines $L_y^0$, $L_y^1$, $L_y^2$, $L_y^3L_y^4$ and $L_y^5$. The bases of the transistors 370, 371, 372, 373, 374 and 375 are connected to a power supply whose voltage is $V_2$.

The operation of the D/A converter of FIG. 3 is explained next.

When the input signals $S_0$, $S_1$ and $S_2$ are high, low and low, respectively, the gate voltages of the transistors $Q_{00}$, $Q_{01}$, ..., $Q_{05}$ are high. In this case, if the base-to-emitter voltages of the transistors 370, 371, ..., 375 are defined by $V_{BE}^0$, $V_{BE}^1$, ..., $V_{BE}^5$, respectively.

$$v_{BE}^0 < V_{th}$$

$$v_{BE}^3 < V_{th}$$

$$v_{BE}^4 < V_{th}$$

where $V_{th}$ is a threshold voltage of the MOS transistors. As a result, the transistors 370, 373 and 374 are turned OFF. On the other hand, since the transistors $Q_{01}$, $Q_{02}$ and $Q_{05}$ are not connected to the signals lines, irrespective of the voltage of the input signal $S_0$, $$v_{BE}^1 \geq V_{th}$$

$$v_{BE}^2 \geq V_{th}$$

$$v_{BE}^5 \geq V_{th}$$

Therefore, the transistors 371, 372 and 375 are turned ON. Thus, $$I_{out} = 2I_o + 4I_o + 32I_o$$
$$= 43I_o$$

Next, when the input signals $S_0$, $S_1$ and $S_2$ are low, high and low, respectively, the gate voltages of the transistors $Q_{10}$, $Q_{11}$, ..., $Q_{15}$ are high. In this case, $$v_{BE}{}^0 < V_{th}$$
$$v_{BE}{}^2 < V_{th}$$
$$v_{BE}{}^4 < V_{th}$$
$$v_{BE}{}^5 < V_{th}$$

As a result, the transistors 370, 372, 374 and 375 are turned OFF. On the other hand, since the transistors $Q_{11}$ and $Q_{13}$ are not connected to the signal lines, irrespective of the voltage of the input signal $S_1$, $$v_{BE}{}^1 \geq V_{th}$$
$$v_{BE}{}^3 \geq V_{th}$$

Therefore, the transistors 371 and 373 are turned ON. Thus, $$I_{out} = 2I_o + 8I_o$$
$$= 10I_o$$

Next, when the input signals $S_0$, $S_1$ and $S_2$ are low, low and high, respectively, the gate voltages of the transistors $Q_{20}$, $Q_{21}$, ..., $Q_{25}$ are high. In this case, $$v_{BE}{}^0 < V_{th}$$
$$v_{BE}{}^3 < V_{th}$$
$$v_{BE}{}^5 < V_{th}$$

As a result, the transistors 370, 373 and 375 are turned OFF. On the other hand, since the transistors $Q_{21}$, $Q_{22}$ and $Q_{24}$ are not connected to the signals lines, irrespective of the voltage of the input signal $S_2$, $$v_{BE}{}^1 \geq V_{th}$$
$$v_{BE}{}^2 \geq V_{th}$$
$$v_{BE}{}^4 \geq V_{th}$$

Therefore, the transistors 371, 372 and 374 are turned ON. Thus, $$I_{out} = 2I_o + 4I_o + 16I_o$$
$$= 22I_o$$

In addition, two of the input signals $S_0$, $S_1$ and $S_2$ can be high, and all of the input signals $S_0$, $S_1$ and $S_2$ can be high. In the latter case, the gate voltages of all the transistors $Q_{00}$, $Q_{01}$, ..., $Q_{25}$ are high. In this case, $$v_{BE}{}^0 < V_{th}$$
$$v_{BE}{}^2 < V_{th}$$
$$v_{BE}{}^3 < V_{th}$$
$$v_{BE}{}^4 < V_{th}$$
$$v_{BE}{}^5 < V_{th}$$

As a result, the transistors 370, 372, 373, 374 and 375 are turned OFF. On the other hand, since the transistors $Q_{01}$, $Q_{11}$ and $Q_{21}$ are not connected to the signals lines, irrespective of the voltage of the input signals $S_0$, $S_1$ and $S_2$, $$v_{BE}{}^1 \geq V_{th}$$

Therefore, only the transistor 371 is turned ON. Thus, $$I_{out} = 2I_0$$

In FIG. 3, since the base of the transistor 202 of the reference current source 2 is connected directly to the bases of the transistors 350, 351, ..., 355 of the digital-to-analog conversion section 3 without switching means, and the switching of the transistors 350, 351, ..., 355 is carried out by the logic circuit 1, the fluctuation of the currents flowing through the transistors 350, 351, ..., 355, i.e., the fluctuation of the output current $I_{out}$ can be suppressed. Also, the logic of the digital-to-analog conversion section 1 is preset by providing the presence or absence of contact throughholes between the sources of the transistors $Q_{00}$, $Q_{01}$, ... $Q_{25}$ and the signal lines $L_y{}^0$, $L_y{}^1$, ..., $L_y{}^5$, thus easily changing the logic of the D/A converter.

Figure 4:
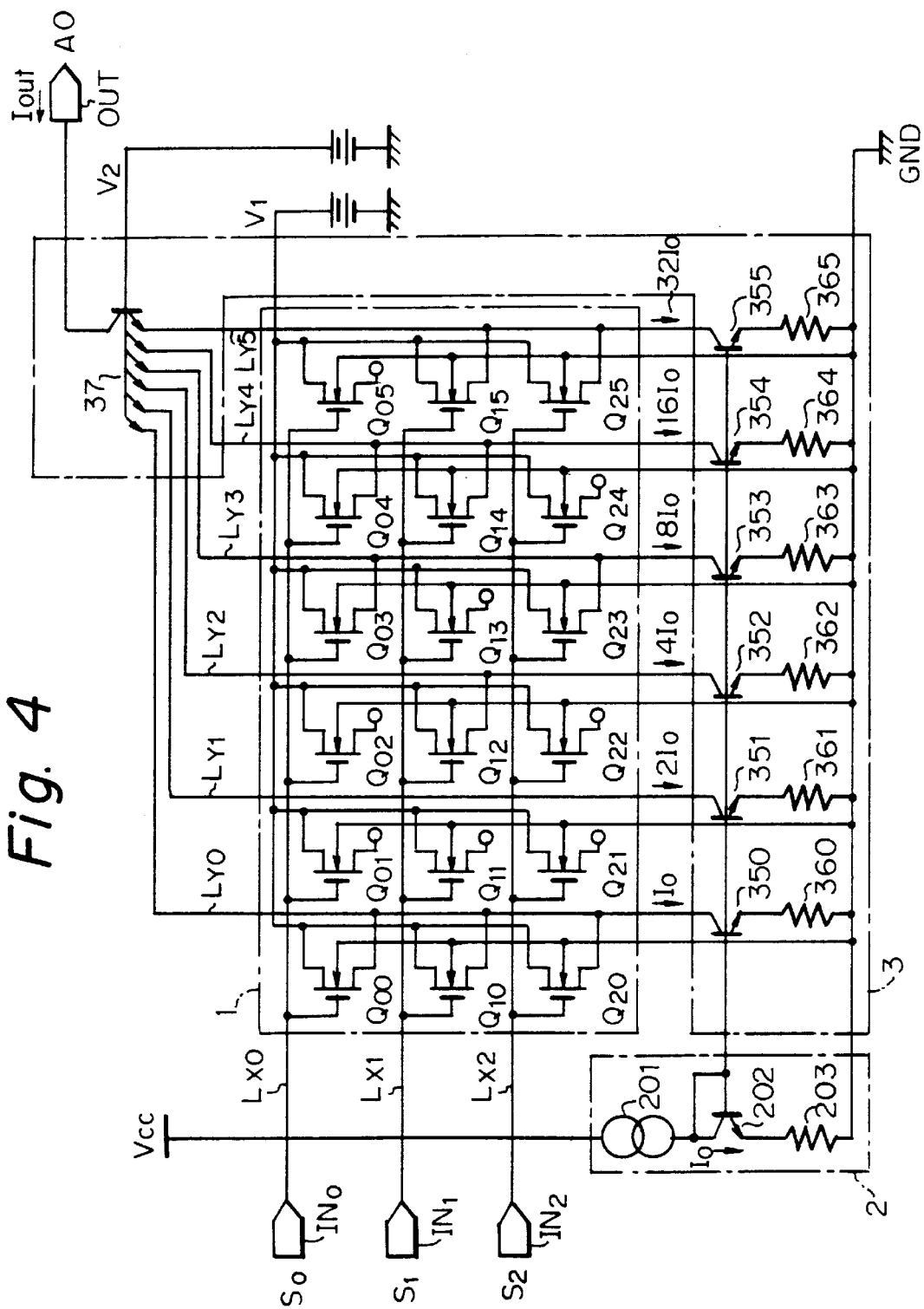
FIG. 4 is a circuit diagram illustrating a second embodiment of the D/A converter according to the present invention.

In FIG. 4, which illustrates a second embodiment of the present invention, the NPN type transistors 370, 371, ..., 375 of FIG. 3 are replaced by a multi-emitter type NPN bipolar transistor 37 which has six emitters. In this case, the operation of the D/A converter of FIG. 4 is the same as that of the D/A converter of FIG. 3.

Figure 5:
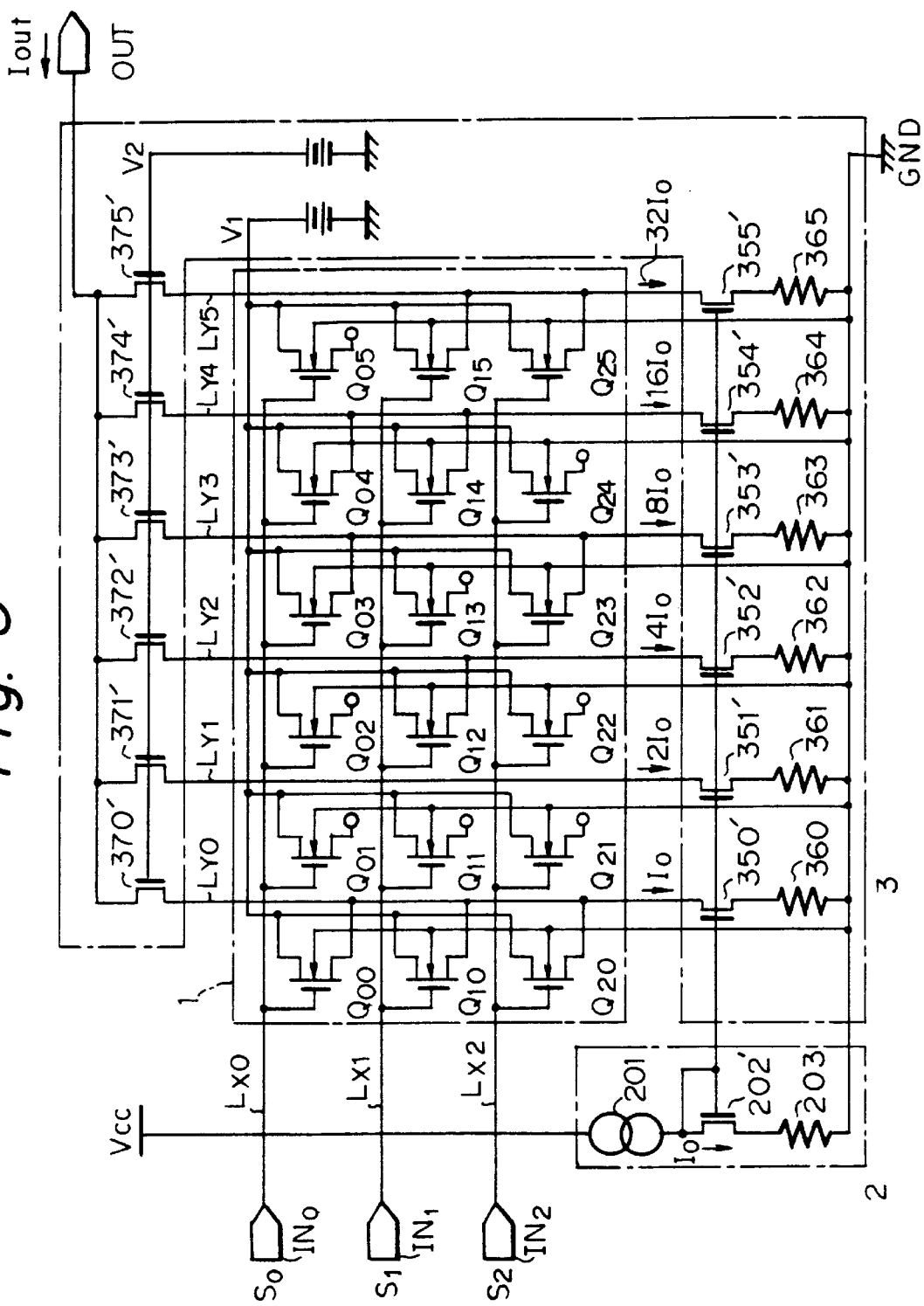
FIG. 5 is a circuit diagram illustrating a modification of the D/A converter of FIG. 3.

In FIG. 5, which is a modification of the D/A converter of FIG. 3, the bipolar transistors 202, 350, 351, ..., 355, 370, 371, ..., 375 of FIG. 3 are replaced by N-channel type MOS transistors 202', 350', 351', ..., 355', 370', 371', ..., 375', respectively. Even in this case, the operation of the D/A converter of FIG. 5 is similar to that of the D/A converter of FIG. 5.

As explained hereinabove, according to the present invention, the fluctuation of the output current can be suppressed.

I claim:
1. A digital-to-analog converter comprising:
   a plurality of input terminals;
   an output terminal;
   a plurality of input signal lines connected to said input terminals, respectively;
   a plurality of output signal lines;
   a logic circuit including a plurality of MOS transistors each having a gate connected to one of said input signal lines, a drain connected to a first power supply terminal and a source which has one of a connection state where said source which has one of a connection state where said source is connected to one of said output signal lines and a disconnection state where said source is not connected to said output signal lines;

a reference current source including a constant current source and a first transistor connected to said constant current source;

a digital-to-analog conversion section including a plurality of second transistors each connected to one of said output signal lines and to said first transistor, each of said second transistors forming a current mirror circuit with said first transistor, and a plurality of third transistors each connected between said output terminal and one of said output signals lines, said first, second and third transistors being bipolar transistors.

2. The converter as set forth in claim 1, wherein a ratio of mutual conductances of said second transistors is $1:2:2^2: \ldots$

\* \* \* \* \*